US012785688B2

(12) United States Patent
Kojima

(10) Patent No.: US 12,785,688 B2
(45) Date of Patent: Nov. 3, 2026

(54) SEMICONDUCTOR DEVICE HAVING DIFFERENT POWER SUPPLIES FOR DIFFERENT CIRCUITS

(71) Applicant: Mitsubishi Electric Corporation, Tokyo (JP)

(72) Inventor: Tomokazu Kojima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 13 days.

(21) Appl. No.: 18/996,691

(22) PCT Filed: Nov. 9, 2022

(86) PCT No.: PCT/JP2022/041678
§ 371 (c)(1),
(2) Date: Jan. 17, 2025

(87) PCT Pub. No.: WO2024/100789
PCT Pub. Date: May 16, 2024

(65) Prior Publication Data
US 2026/0019080 A1 Jan. 15, 2026

(51) Int. Cl.
*H03K 19/00* (2006.01)
*H03K 19/0185* (2006.01)

(52) U.S. Cl.
CPC . *H03K 19/0016* (2013.01); *H03K 19/018571* (2013.01)

(58) Field of Classification Search
CPC ....... H03K 19/0016; H03K 19/018571; H03K 19/018521; H03K 19/0013; H03K 19/0008; H03K 19/00369; H03K 19/00384; H03K 19/018557; H03K 19/018507; H03K 19/0185; H03K 19/0175; H03K 3/012; H03K 17/22; H03K 17/223; H03K 17/24;
(Continued)

(56) References Cited

U.S. PATENT DOCUMENTS

2006/0033530 A1* 2/2006 Seo .................... H03K 19/0016 326/81

FOREIGN PATENT DOCUMENTS

WO 2007004294 A1 1/2007

OTHER PUBLICATIONS

International Search Report (PCT/ISA/210) with translation and Written Opinion (PCT/ISA/237) mailed on Jan. 24, 2023, by the Japanese Patent Office as the International Searching Authority for International Application No. PCT/JP2022/041678. (10 pages).

* cited by examiner

*Primary Examiner* — Jung Kim
(74) *Attorney, Agent, or Firm* — .Buchanan Ingersoll & Rooney PC

(57) ABSTRACT

A first circuit block operates with a first power supply voltage and a reference voltage. A second circuit block operates with a second power supply voltage and a reference voltage. Upon activation of a semiconductor device, a voltage of a first power supply line changes from the reference voltage to the first power supply voltage earlier than when a voltage of the second power supply line changes from the reference voltage to the second power supply voltage. A first switch is connected between the second power supply line and a node which transfers a signal to be processed by the first circuit block or the second circuit block. The first switch is on when the voltage of the second power supply line is the reference voltage and turns off as the voltage of the second power supply line approaches the second power supply voltage.

11 Claims, 14 Drawing Sheets

(58) Field of Classification Search
CPC ......... H03K 2017/226; H03K 3/02335; H03K 3/0375; H03K 3/2865; H03K 3/356008; H10D 84/00; G06F 1/24; G06F 1/26; G06F 1/30; G06F 1/305; G06F 1/32; G06F 1/3203; H03L 5/02; H03L 7/00
See application file for complete search history.

FIG.7

| FIRST BLOCK (VDD1) | SECOND BLOCK (VDD2) | POWER SUPPLY VOLTAGE |
|---|---|---|
| DIGITAL CIRCUIT (E.X.: INPUT CIRCUIT/ CONTROL LOGIC) | ANALOG CIRCUIT (E.X.: OUTPUT CIRCUIT) | VDD1<VDD2 |
| ANALOG CIRCUIT (E.X. INPUT CIRCUIT) | DIGITAL CIRCUIT (E.X.: CONTROL LOGIC/ OUTPUT CIRCUIT) | VDD1>VDD2 |
| ANALOG CIRCUIT (E.X.: INPUT CIRCUIT/ CONTROL LOGIC) | ANALOG CIRCUIT (E.X.: OUTPUT CIRCUIT) | VDD1<VDD2 (VDD1>VDD2) |
| DIGITAL CIRCUIT (E.X.: INPUT CIRCUIT/ CONTROL LOGIC) | DIGITAL CIRCUIT (E.X.: OUTPUT CIRCUIT) | VDD1<VDD2 (VDD1>VDD2) |

SEMICONDUCTOR DEVICE HAVING DIFFERENT POWER SUPPLIES FOR DIFFERENT CIRCUITS

TECHNICAL FIELD

The present disclosure relates to a semiconductor device.

BACKGROUND ART

In recent years, a semiconductor device which operates with supply of multiple power supply voltages are used, such as mixed embedding of an analog circuit and a digital circuit. For example, WO2007/004294 (PTL 1) discloses a level converter circuit (in general, also referred to as a level shift circuit) which converts, with supply of voltages Vd1 and Vd2 (Vd2>Vd1), a signal whose amplitude is voltage Vd1 into a signal whose amplitude is voltage Vd2.

In such a configuration of use of multiple power supplies, since the start timings of the supplies of the power supply voltages are different upon the activation of the semiconductor device, a condition may occur in which only some of the power supply voltages is supplied. For example, in a configuration in which some power supply voltages are supplied external to the semiconductor device and those power supply voltages are used to generate other power supply voltages within the semiconductor device, it is inevitable that a condition occurs in which only those power supply voltages are supplied. Even in a configuration in which all the power supply voltages are supplied external to the semiconductor device, there is a case where a predetermined order is present preceding or subsequent to the input of the power supply voltages.

While only some power supply voltages are being supplied, some nodes go to a high-impedance (Hi-Z) state under the influence of a power supply voltage the supply of which starts later, arousing a concern that a shoot-through current may occur within the device.

In the level converter circuit disclosed in PTL 1, a circuit structure is disclosed, which includes a switch for clamping the potential of an input node to a circuit element such as an inverter upon the start of the supplies of voltages Vd1 and Vd2. Specifically, as the switch, a P-type field effect transistor is used which has the source connected to a voltage Vd2 supply node, the drain connected to the above input node, and the gate connected to a voltage Vd1 supply node. Note that, in the following, a P-type field effect transistor and a N-type field effect transistor will also simply be referred to as a P-type transistor and a N-type transistor.

Due to this, in PTL 1, since the potential of the input node can be clamped when voltages Vd1 and Vd2 are generated, the above-described shoot-through current can be prevented from occurring.

CITATION LIST

Patent Literature

PTL 1: WO2007/004294

SUMMARY OF INVENTION

Technical Problem

However, in the configuration of PTL 1, after voltages Vd1 and Vd2 are supplied, a voltage difference (Vd1−Vd2) occurs constantly between the gate and the source of the P-type transistor operating as the switch for the voltage clamp upon the supply of voltages Vd1 and Vd2. As a result, unnecessary leakage current, depending on the on-resistance as a function of the voltage difference, occurs constantly at the P-type transistor, arousing a concern that the power consumption may increase after the activation of the semiconductor device (when operating in a steady state).

The present disclosure is made to solve such a problem, and an object of the present disclosure is to implement both: prevention of a shoot-through current upon the activation of a semiconductor device which operates with multiple power supply voltages the supplies of which start at different timings; and reduction of power consumption after the activation.

Solution to Problem

According to a certain aspect of the present disclosure, a semiconductor device is provided. The semiconductor device includes: a first power supply line to receive supply of a first power supply voltage; a second power supply line to receive supply of a second power supply voltage; a reference voltage line to transfer a reference voltage; a first block; a second block; and a first switch. Upon activation of the semiconductor device, a voltage of the first power supply line changes from the reference voltage to the first power supply voltage earlier than when a voltage of the second power supply line changes from the reference voltage to the second power supply voltage. The first block operates with the first power supply voltage and the reference voltage from the first power supply line and the reference voltage line. The second block operates with the second power supply voltage and the reference voltage from the second power supply line and the reference voltage line. The first switch is connected between the second power supply line and a node which transfers a signal to be processed by the first block or the second block. The first switch is on when the voltage of the second power supply line is the reference voltage, and the first switch turns off as the voltage of the second power supply line approaches the second power supply voltage.

Advantageous Effects of Invention

According to the present disclosure, the prevention of a shoot-through current upon the activation of the semiconductor device which operates with multiple power supply voltages the supplies of which start at different timings; and the reduction of power consumption after the activation can both be implemented by placing the first switch.

BRIEF DESCRIPTION OF DRAWINGS

FIG. 7 is a chart illustrating an example configuration of a first block and a second block.

DESCRIPTION OF EMBODIMENTS

Hereinafter, embodiments according to the present disclosure will be described in detail, with reference to the accompanying drawings. Note that, in the following, like reference sign is used to refer to like or corresponding parts, and the description thereof will, in principle, not be repeated.

Embodiment 1

Figure 1:
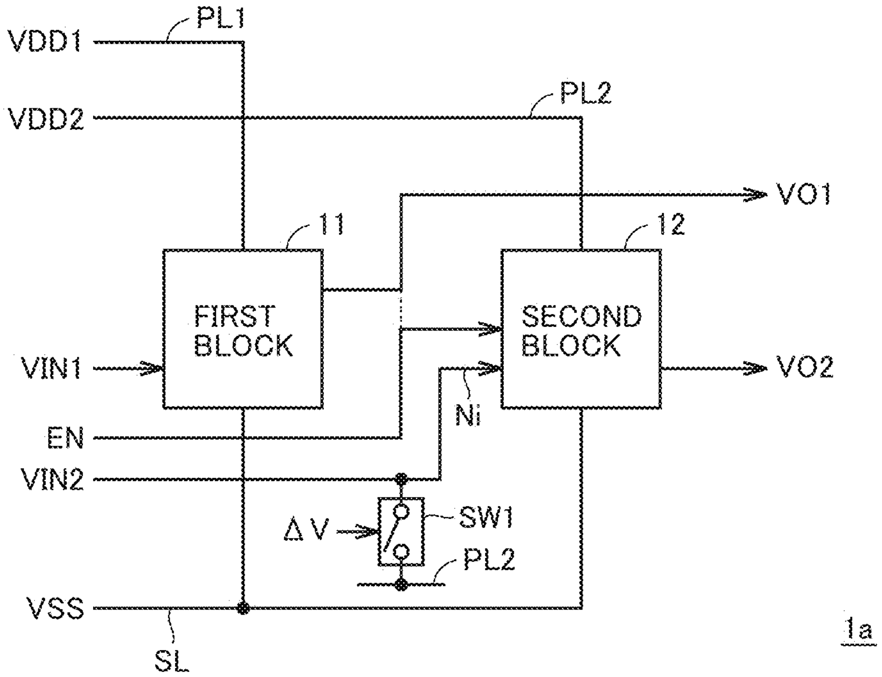
FIG. 1 is a block diagram illustrating a configuration of a semiconductor device according to Embodiment 1.

FIG. 1 is a block diagram illustrating a configuration of a semiconductor device 1*a* according to Embodiment 1.

As shown in FIG. 1, semiconductor device 1*a* according to Embodiment 1 includes: power supply lines PL1 and PL2; a reference voltage line SL for transferring a reference voltage VSS; a first block 11; a second block 12; and a switch SW1.

Reference voltage VSS is, representatively, a ground (a ground voltage). Thus, in the following, reference voltage VSS will be referred to as a ground voltage VSS, and reference voltage line SL will also be referred to as a ground line SL. Power supply line PL1 receives supply of a power supply voltage VDD1. Power supply line PL2 receives supply of a power supply voltage VDD2. In the example of FIG. 1, power supply voltages VDD1 and VDD2 are supplied external to semiconductor device 1*a*.

Upon activation of semiconductor device 1*a*, voltage V (PL1) of power supply line PL1, with supply of power supply voltage VDD1, changes from ground voltage VSS to power supply voltage VDD1. Similarly, with the supply of power supply voltage VDD2, voltage V (PL2) of power supply line PL2 changes from ground voltage VSS to power supply voltage VDD2.

In the present embodiment, power supply voltage VDD1 is supplied prior to power supply voltage VDD2, that is, the supply of power supply voltage VDD1 starts before the supply of power supply voltage VDD2 starts. In other words, examples will be described, assuming that the timing at which the voltage V (PL1) changes from ground voltage VSS to power supply voltage VDD1 is earlier than the timing at which the voltage V (PL2) changes from ground voltage VSS to power supply voltage VDD2.

First block 11 and second block 12 each include a transistor (representatively, a field effect transistor) not shown. First block 11 processes an input signal VIN1 to generate an output signal VO1.

Second block 12 operates during a time period in which an enable signal EN is at a logic high level (hereinafter, simply denoted as "H level") and stops operating during a time period in which the enable signal EN is at a logic low level (hereinafter, simply denoted as "L level"). In operation, second block 12 processes an input signal VIN2 of a node Ni to generate an output signal VO2. Output signal VO1 of first block 11 may be transferred to node Ni, as input signal VIN2. Alternatively, conversely, output signal VO2 of second block 12 may be processed at first block 11 as input signal VIN1.

Switch SW1 is connected between node N1 and power supply line PL2 supplying power supply voltage VDD2 the supply of which starts later. Switch SW1 turns on and off depending on a voltage difference ΔV of power supply line PL2 relative to ground line SL. Specifically, switch SW1 operates so as to be kept on when voltage difference ΔV is small, that is, when voltage V (PL2) of power supply line PL2 is equal to VSS, and turns off as the voltage of power supply line PL2 approaches power supply voltage VDD2 and voltage difference ΔV increases. Then, when voltage V (PL2) of power supply line PL2 is equal to VDD2, switch SW1 is kept off.

Note that, in the example of FIG. 1, node Ni at which the switch SW1 is placed is the node that transfers input signal VIN2 processed by second block 12. However, switch SW1 can be placed between power supply line PL2 and the node for transferring input signal VIN1 processed at first block 11 as node Ni. Furthermore, switch SW1 can be placed at both the node for transferring input signal VIN1 (first block 11) and the node for transferring input signal VIN2 (second block 12). Moreover, node Ni may be a node (not shown) inside the first block 11 or second block 12 or may be any node for transferring the signal to be processed at first block 11 or second block 12. For example, switch SW1 can be placed for any node which may cause a shoot-through current inside the first block 11 or second block 12 when going to the Hi-Z state, representatively, a node connected to the gate of field effect transistor.

Figure 2:
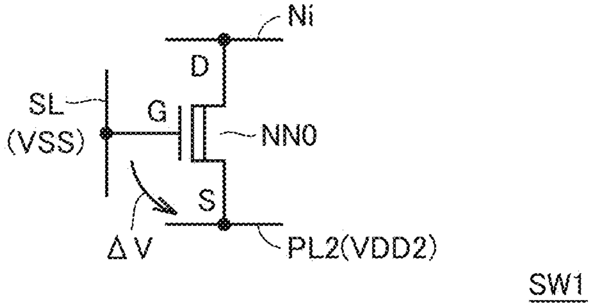
FIG. 2 is a circuit diagram showing an example configuration of a pull-down switch.

Next, referring to FIG. 2, an example configuration of switch SW1 is now described. As shown in FIG. 2, for example, switch SW1 can be configured of a N-type native transistor NN0. The native transistor is a field effect transistor, represented by a MOS (Metal Oxide Semiconductor) transistor, which has characteristics that a threshold voltage Vt is near 0 [V]. An enhancement-type field effect transistor, in contrast, has a threshold voltage Vt of about 0.8 [V].

Native transistor NN0 is connected between node N1 and power supply line PL2, and has the gate (a control electrode) connected to ground line SL. Accordingly, when the voltage of power supply line PL2 is ground voltage VSS, the gate-source voltage is 0 [V], which, therefore, turns native transistor NN0 on. As the voltage of power supply line PL2 changes from ground voltage VSS to power supply voltage VDD2, in contrast, the gate (G) goes to low potential relative to the source(S), which, therefore, turns native transistor NN0 off. As a result, the function of switch SW1 shown in FIG. 1 is implemented by N-type native transistor NN0 illustrated in FIG. 2.

Figure 3:
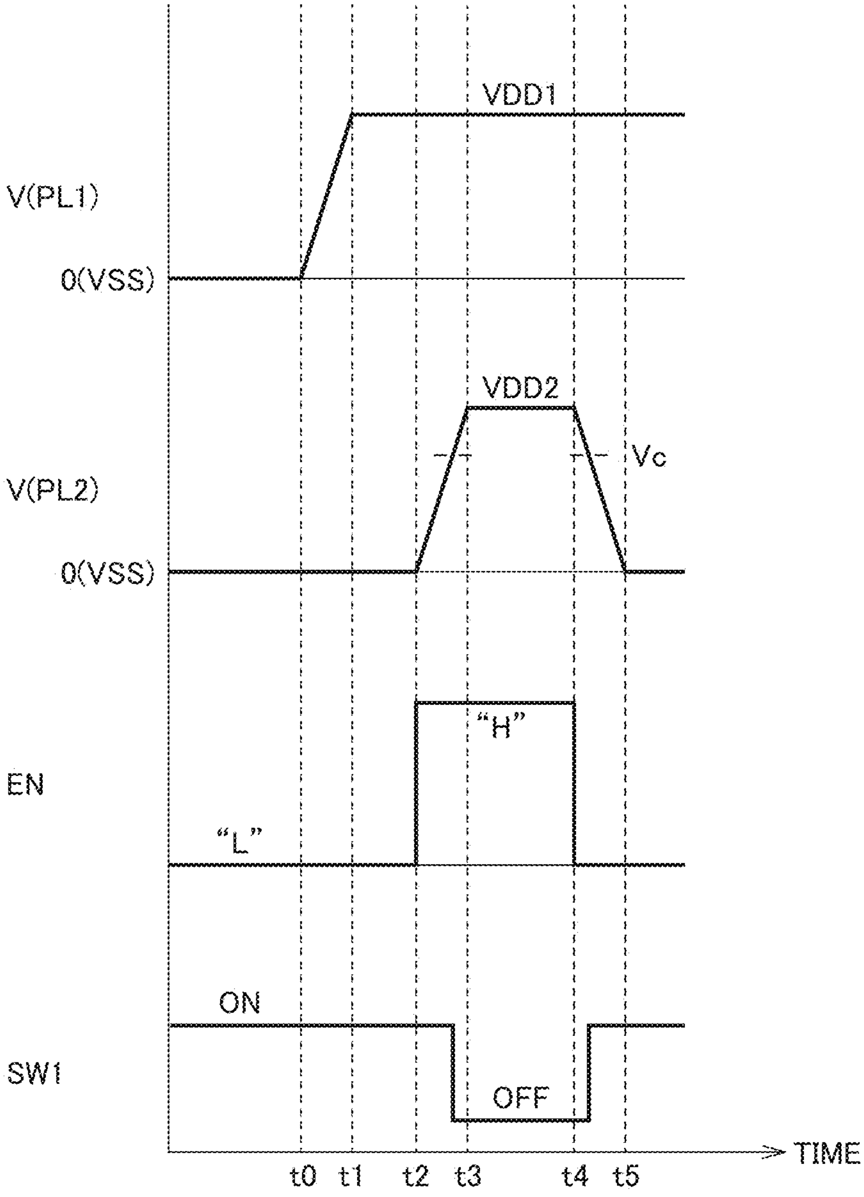
FIG. 3 is a schematic waveform diagram for illustrating an operation of the semiconductor device according to Embodiment 1 upon activation.

FIG. 3 shows a schematic waveform diagram illustrating an operation of semiconductor device 1*a* of FIGS. 1 and 2 upon activation.

Referring to FIG. 3, at time to, as the supply of power supply voltage VDD1 to power supply line PL1 starts, voltage V (PL1) of power supply line PL1 increases from ground voltage VSS. Voltage V (PL1) reaches power supply voltage VDD1 at time t1.

At time t2 subsequent to time to, as the supply of power supply voltage VDD2 to power supply line PL2 starts, voltage V (PL2) of power supply line PL2 increases from ground voltage VSS. Voltage V (PL2) reaches power supply voltage VDD1 at time t3 after time t1.

Enable signal EN is set to H level in correspondence with the operation period of second block 12. Accordingly, a power supply voltage VDD2 supply period, corresponding to the time period during which the enable signal EN is at H level, can also be provided. In the example of FIG. 3, enable signal EN is set to H level in a time period from time t2 to t4.

Due to this, at time t4, the supply of power supply voltage VDD2 to power supply line PL2 is stopped. After time t4, voltage V (PL2) of power supply line PL2 changes toward ground voltage VSS by the power supply line PL2 discharging. Note that in a time period during which the enable signal EN is at L level, a pull-down switch may be provided for connecting power supply line PL2 to ground line SL for allowing power supply line PL2 to discharge, as will be described in a variation below.

Operations of switch SW1 corresponding to changes in voltage of power supply lines PL1 and PL2 are now described. Since ground line SL is clamped to ground voltage VSS, voltage difference ΔV shown in FIGS. 1 and 2 corresponds to voltage V (PL2) of power supply line PL2.

In the time period (V (PL2)=VSS) until time t2 before the voltage of power supply line PL2 changes, the gate-source voltage of native transistor NN0 of FIG. 2 is 0 [V], corresponding to voltage difference ΔV=0. Switch SW1 (native transistor NN0) is, thus, on. This causes node Ni of FIG. 1 to be clamped to ground voltage VSS, without going to the Hi-Z state. As a result, a shoot-through current can be prevented from occurring within second block 12.

After time t2, in contrast, voltage difference ΔV increases as the voltage V (PL2) changes toward power supply voltage VDD2. Due to this, as voltage difference ΔV of the source from the gate increases to be greater than a voltage Vc, that is, as voltage V (PL2) of power supply line PL2 increases to be higher than voltage Vc, native transistor NN0 of FIG. 2 is turned off. While voltage V (PL2) is greater than Vc, switch SW1 (native transistor NN0) is off. Note that the voltage Vc is a constant voltage depending on the physical property value of native transistor NN0, and is about 0.5 [V], for example.

Due to this, in the time period during which the second block is in operation with supply of power supply voltage VDD2, node Ni is electrically disconnected from ground voltage VSS and transfers input signal VIN2 to second block 12. Furthermore, in the time period where V (PL2) is greater than Vc, switch SW1 (native transistor NN0) is turned off and unnecessary leakage current as disclosed in PTL 1 does not occur.

As such, in the semiconductor device according to Embodiment 1 having a configuration of operating with power supply voltages VDD1 and VDD2 that are different in timing to start the supply, the active pull-down switch SW1, which is turned on and off depending on the voltage of power supply line PL2, is provided between node Ni and power supply line PL2 supplying power supply voltage VDD2, the supply of which starts later.

This enables, in the time period before the supply of the power supply voltage (V (PL2)<Vc) starts, to clamp (pull down) node Ni to ground voltage VSS by turning on switch SW1, without bringing node Ni into the Hi-Z state. A shoot-through current is, thereby, prevented from occurring within second block 12 processing the signal of node Ni.

Furthermore, keeping switch SW1 off during the operation period of second block 12 after the supply of power supply voltage VDD2 (V (PL2)>Vc) can avoid unnecessary current consumption in a steady state from being caused by the mechanism to prevent a shoot-through current upon activation. As a result, prevention of a shoot-through current upon activation and reduction of power consumption after the activation can both be implemented.

Variation of Embodiment 1

Figure 4:
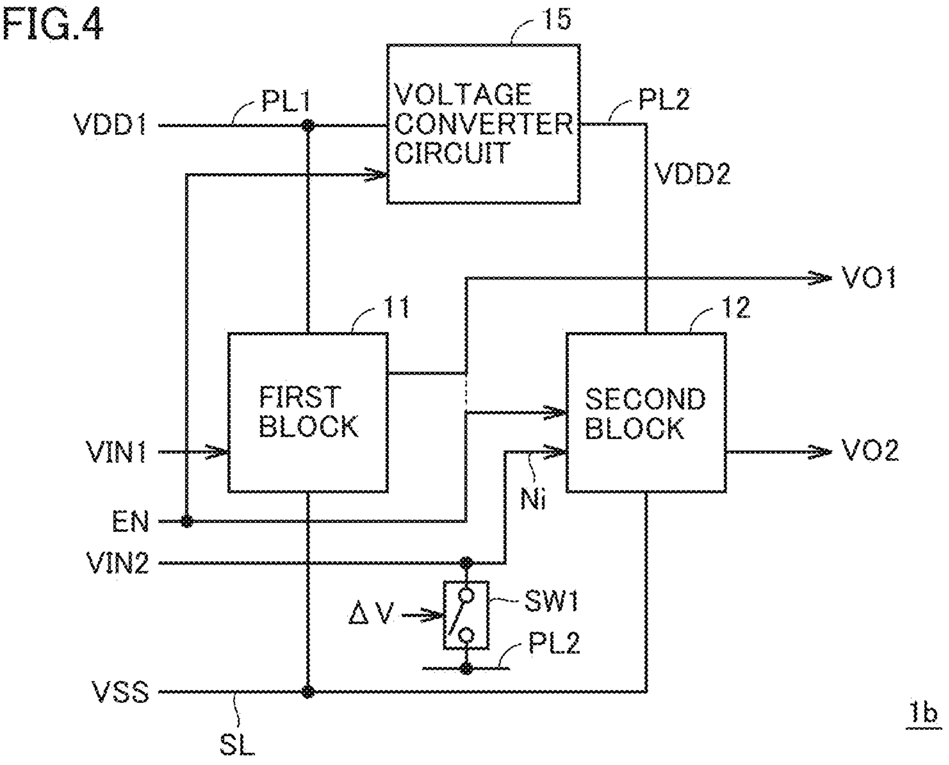
FIG. 4 is a block diagram illustrating a configuration of a semiconductor device according to Variation 1 of Embodiment 1.

FIG. 4 is a block diagram illustrating a configuration of a semiconductor device 1*b* according to Variation 1 of Embodiment 1.

Referring to FIG. 4, semiconductor device 1*b* according to Variation 1 of Embodiment 1 is the same as the semiconductor device 1*a* (FIG. 1) according to Embodiment 1, except for further including a voltage converter circuit 15. Voltage converter circuit 15 generates power supply voltage VDD2 through DC-to-DC conversion using power supply voltage VDD1 on power supply line PL1, and outputs power supply voltage VDD2 to power supply line PL2.

For example, voltage converter circuit 15 is configured to operate in response to enable signal EN. It is understood that, in response to enable signal EN, the output of power supply voltage VDD2 from voltage converter circuit 15 to power supply line PL2 is controlled and voltage V (PL2) of power supply line PL2, thereby, behaves in the same manner as shown in FIG. 3.

Since the other configuration and operation of semiconductor device 1*b* are the same as those of semiconductor device 1*a*, detailed description thereof will not be repeated. Moreover, in the configuration of FIG. 1, voltage converter circuit 15 may be disposed outside the semiconductor device 1*a*.

As a result, since the active pull-down switch SW1 is provided in the semiconductor device according to Variation 1 of Embodiment 1 too, prevention of a shoot-through current upon activation and reduction of power consumption after the activation can both be implemented, benefiting from the same advantageous effects as those of Embodiment 1.

Figure 5:
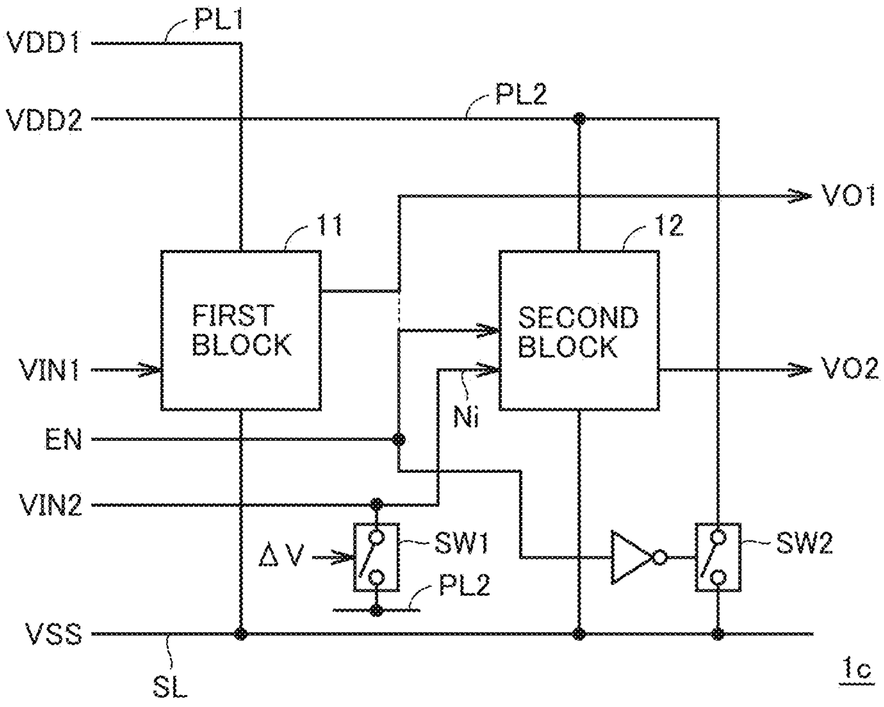
FIG. 5 is a block diagram illustrating a configuration of a semiconductor device according to Variation 2 of Embodiment 1.

FIG. 5 is a block diagram illustrating a configuration of a semiconductor device 1*c* according to Variation 2 of Embodiment 1.

Referring to FIG. 5, semiconductor device 1*c* according to Variation 2 of Embodiment 1 is the same as the semiconductor device 1*a* (FIG. 1) according to Embodiment 1, except for further including a switch SW2. Switch SW2 is placed, intended to pull down power supply line PL2 supplying power supply voltage VDD2 the supply of which starts later, to make sure that the switch SW1 is on during a time period in which the power supply voltage VDD2 is not supplied.

Accordingly, switch SW2 is connected between ground line SL and power supply line PL2 and configured to turn on and off in accordance with an inverted signal of enable signal EN. Specifically, switch SW2 is on during the time period in which the enable signal EN is at L level, and switch SW2 is off during the time period in which the enable signal EN is at H level. For example, switch SW2 can be configured of an enhancement-type N-type transistor whose gate receives the input of the inverted signal of enable signal EN.

Figure 6:
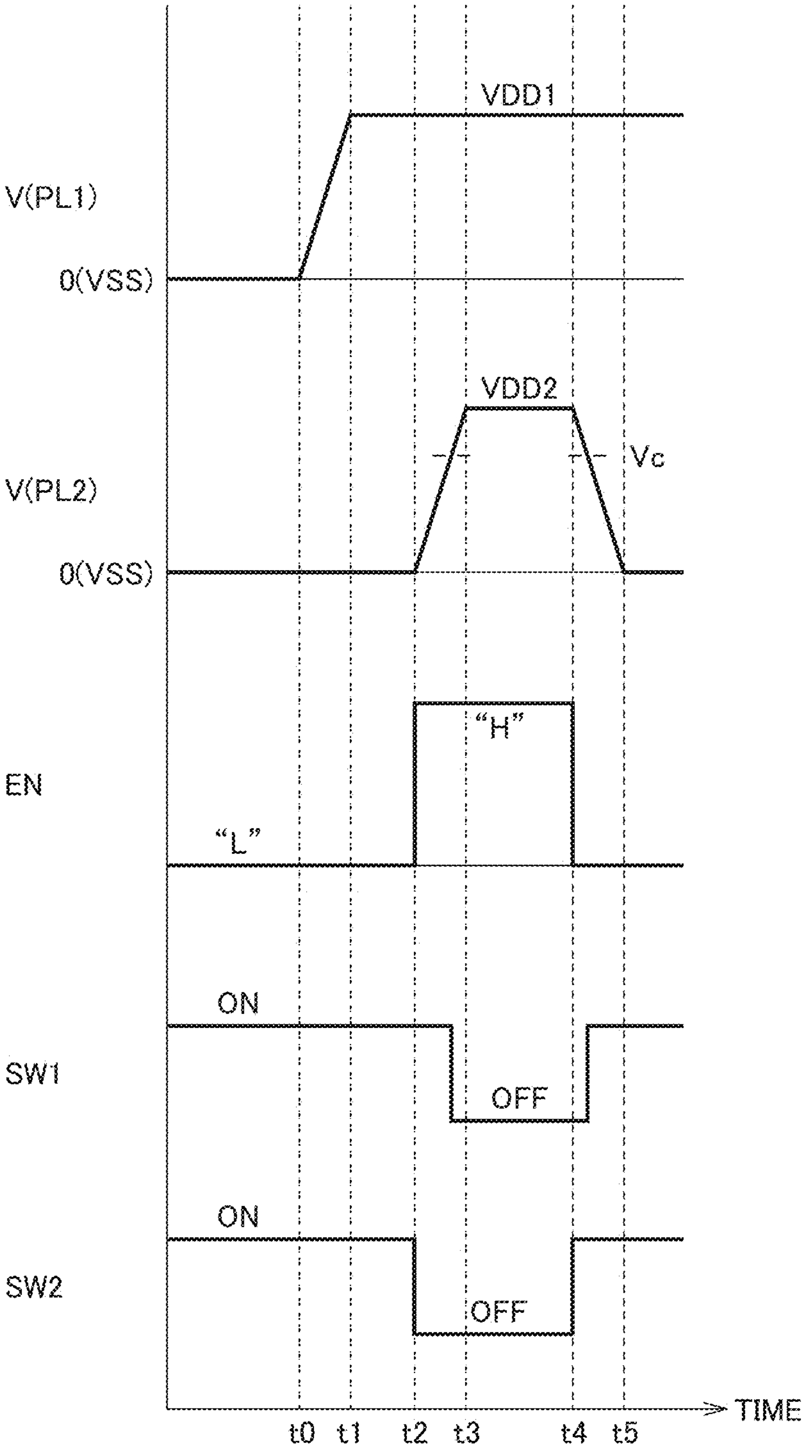
FIG. 6 is a schematic waveform diagram for illustrating an operation of a semiconductor device according to Variation 2 of Embodiment 1 upon activation.

FIG. 6 is a schematic waveform diagram for illustrating an operation of semiconductor device 1*c* of FIG. 5 upon activation. FIG. 6 shows a waveform indicating on and off of switch SW2, in addition to the waveform diagram of FIG. 3. In other words, the voltages of power supply lines PL1 and PL2, enable signal EN, and the waveforms regarding the on and off of switch SW1 in FIG. 6 are the same as those shown in FIG. 3.

As shown in FIG. 6, switch SW2 is off during a time period in which the enable signal EN is at H level, that is, while second block 12, in which the power supply voltage VDD2 is supplied to power supply line PL2, is in operation, and on during a time period in which the enable signal EN is at L level, that is, while second block 12 is out of operation.

As a result, during the time period in which the power supply voltage VDD2 is not supplied to power supply line PL2, for example, before time t2 of FIG. 6 and after time t4, power supply line PL2 is electrically connected to ground line SL and is, thereby, pulled down. Due to this, voltage difference ΔV between power supply line PL2 and ground line SL is equal to zero in this time period, ensuring that the pull-down switch SW1 placed at node Ni is turned on so as to prevent a shoot-through current.

Thus, according to the semiconductor device of Variation 2 of Embodiment 1, the effectiveness of prevention of a shoot-through current upon activation can be enhanced, in addition to the same advantageous effects as those of Embodiment 1 obtained from the placement of switch SW1.

FIG. 7 shows an example configuration of first block 11 and second block 12 in the semiconductor device according to Embodiment 1 and Variations 1 and 2 thereof.

In recent years, a semiconductor device such as an application specific integrated circuit (ASIC) including mixed embedding of a digital circuit and an analog circuit is widely used. It is known that the power consumption of the digital circuit is, depending on the charging and discharging of the parasitic capacitance, proportional to the product of the operating frequency (a clock frequency) and the square of the voltage amplitude of a digital signal, whereas the power consumption of the analog circuit is proportional to the product of the power supply voltage and a bias current. Due to this, reducing the power supply voltage provides a great effect on reduction of the power consumption by the digital circuit. In contrast, the effect of the reduction of the power supply voltage on reduction of the power consumption by the analog circuit is not as much as on the digital circuit. Thus, considering a dynamic range, distortions, and noise effects, reducing the power supply voltage is not necessarily preferable.

In this context, an application tends to be employed in which the analog circuit and the digital circuit have different power supply voltage levels, and, by way of example, the power supply voltage of the digital circuit is about 1.5 [V], and the power supply voltage of the analog circuit is 3.3 [V] or 5 [V].

Accordingly, as shown in Examples 1 and 2 of FIG. 7, first block 11 and second block 12, which operate with different power supply voltages VDD1 and VDD2, can be configured of a digital circuit and an analog circuit each. For example, the digital circuit is configured of a large-scale circuit for control logic operation, and the analog circuit is configured in a smaller scale focusing on the input-output function of signals.

In Example 1 of FIG. 7, first block 11, which operates with power supply voltage VDD1 the supply of which starts earlier, is configured of a digital circuit, while second block 12, which operates with power supply voltage VDD2 the supply of which starts later, is configured of an analog circuit. In this case, VDD1<VDD2 holds true. Thus, voltage converter circuit 15 of FIG. 4 can be configured of a boost chopper or a boost circuit such as a charge pump circuit.

In Example 2 of FIG. 7, conversely, first block 11, which operates with power supply voltage VDD1, is configured of an analog circuit, while second block 12, which operates with power supply voltage VDD2, is configured of a digital circuit. In this case, VDD2<VDD1 holds true. Thus, voltage converter circuit 15 of FIG. 4 can be configured of a buck chopper or a buck circuit such as a voltage down converter (VDC).

Alternatively, as shown in Example 3 of FIG. 7, both first block 11 and second block 12 may be configured of an analog circuit. Similarly, as shown in Example 4 of FIG. 7, both first block 11 and second block 12 may be configured of a digital circuit.

In Examples 3 and 4, since the power supply voltages of the input and output circuits are tailored to the voltage level of the preceding or subsequent circuit, the relationship between power supply voltages VDD1 and VDD2 may be either VDD1>VDD2 or VDD1<VDD2. Typically, it is free to set the power supply voltage for the control logic operation between the input and the output. Thus, preferably, in terms of power consumption, the control logic operation is performed at a block having a lower power supply voltage. Accordingly, in Examples 3 and 4 of FIG. 7 where the control logic is operated at first block 11, VDD1<VDD2 is preferable.

As can be understood from FIG. 7, the semiconductor device according to the present embodiment is applicable, irrespective of which of power supply voltage VDD1, the supply of which starts earlier, and power supply voltage VDD2, the supply of which starts later, is higher or lower.

Alternatively, the semiconductor device according to the present embodiment is applicable even if power supply voltage VDD2 is a negative voltage. In this case, for example, voltage converter circuit 15 can be configured of a charge pump circuit for generating a negative voltage.

Accordingly, in semiconductor device 1*a* of FIG. 1, an example configuration in which the power supply voltage VDD2 is a negative voltage (VDD2<0) will be described below as Variation 3 of Embodiment 1.

Figure 8:
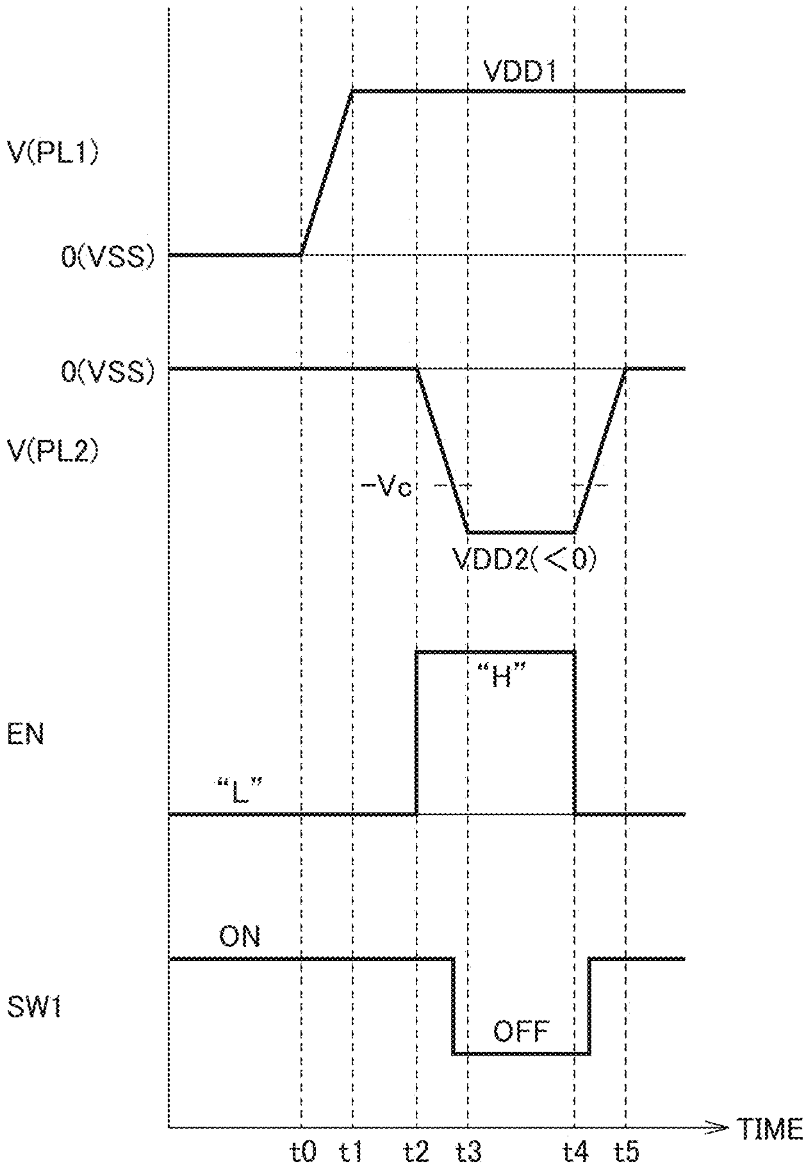
FIG. 8 is a schematic waveform diagram for illustrating an operation of a semiconductor device according to Variation 3 of Embodiment 1 upon activation.

FIG. 8 shows a schematic waveform diagram for illustrating an operation of the semiconductor device according to Variation 3 of Embodiment 1 upon activation. FIG. 8 is the same as the waveform diagram of FIG. 3, except that the power supply voltage VDD2 supplied to power supply line PL2 is a negative voltage (VDD2<0). In other words, the voltage of power supply line PL1 and the waveform of enable signal EN in FIG. 8 are the same as those shown in FIG. 3.

Figure 9:
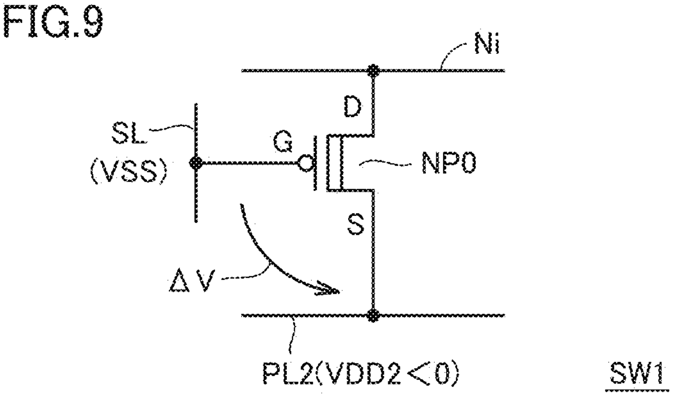
FIG. 9 is a circuit diagram showing an example configuration of a pull-down switch in the semiconductor device according to Variation 3 of Embodiment 1.

As shown in FIG. 9, when power supply voltage VDD2 is a negative voltage, switch SW1 of FIG. 1 can be configured of a P-type native transistor NP0 whose threshold voltage Vt is near 0 [V].

Similarly to native transistor NN0 of FIG. 2, native transistor NP0 is connected between node N1 and power supply line PL2 and has the gate (a control electrode) connected to ground line SL.

Native transistor NP0 is on when the voltage of power supply line PL2 is ground voltage VSS because the gate-source voltage is 0 [V]. In contrast, native transistor NP0 is turned off as the voltage of power supply line PL2 changes from ground voltage VSS to power supply voltage VDD2 (a negative voltage) and the potential of the gate (G) is high relative to the source(S).

Referring, again, to FIG. 8, in the time period (V (PL2) =VSS) until time t2 before the voltage of power supply line PL2 changes, the gate-source voltage of native transistor NP0 of FIG. 9 is 0 [V], corresponding to voltage difference ΔV=0. Thus, switch SW1 (native transistor NP0) is on. This causes node Ni of FIG. 1 to be clamped to ground voltage VSS, without going to the Hi-Z state. As a result, a shoot-through current can be prevented from occurring within second block 12.

After time t2, in contrast, voltage difference ΔV increases as voltage V (PL2) changes toward power supply voltage VDD2 (the negative voltage). As voltage difference ΔV of the source(S) from the gate (G) decreases to be less than a voltage-Vc, that is, as voltage V (PL2) of power supply line PL2 decreases to be lower than voltage −Vc, native transistor NP0 of FIG. 9 is turned off. While voltage V (PL2) is less than −Vc, switch SW1 (native transistor NP0) is off. Note that the voltage −Vc is a constant voltage depending on the physical property value of native transistor NP0, and is about −0.5 [V], for example.

Encompassing FIGS. 2 and 9, switch SW1 (native transistors NN0 and NP0) is on when the absolute value |ΔV| of the voltage difference between power supply line PL2 and ground line SL is less than the predetermined voltage Vc, and switch SW1 is off when |ΔV| is greater than Vc. Switch SW1, thereby operates as the active pull-down switch as described in Embodiment 1.

In this manner, in the semiconductor device according to Variation 3 of Embodiment 1, prevention of a shoot-through current upon activation and reduction of power consumption after the activation can both be implemented, as with Embodiment 1, even when power supply voltage VDD2 supplied to power supply line PL2 having switch SW1 placed thereon is a negative voltage.

Moreover, in Variation 3 of Embodiment 1, power supply voltage VDD1 may further be a negative voltage and the same switch SW2 as that of Variation 2 of Embodiment 1 may further be placed. Moreover, power supply voltage VDD2 may be configured of voltage converter circuit 15 that is disposed inside or outside the semiconductor device 1*c*. In this manner, Embodiment 1 and the variations thereof can be combined as appropriate to an extent that causes no technical inconsistency or conflict.

In the above-described Embodiment 1 and the variations thereof, power supply line PL1 corresponds to one example of a "first power supply line," power supply line PL2 corresponds to one example of a "second power supply line," power supply voltage VDD1 corresponds to one example of a "first power supply voltage," and power supply voltage VDD2 corresponds to one example of a "second power supply voltage." Furthermore, switch SW1 corresponds to one example of a "first switch," and switch SW2 corresponds to one example of a "second switch."

Embodiment 2

In Embodiment 2, an example configuration of a level shift circuit will be primarily described as a specific example of the semiconductor device according to Embodiment 1 and the variations thereof.

Figure 10:
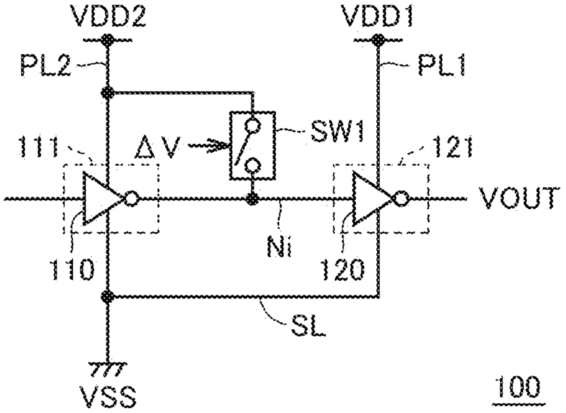
FIG. 10 is a schematic view illustrating a configuration of a level shift circuit according to Example 1 of Embodiment 2.

FIG. 10 is a schematic view illustrating a configuration of a level shift circuit 100 according to Example 1 of Embodiment 2.

Referring to FIG. 10, level shift circuit 100 includes an input unit 111 which receives an input signal VIN whose amplitude is a power supply voltage VDD2, and an output unit 121 which generates an output signal VOUT whose amplitude is a power supply voltage VDD1.

In Embodiment 2 also, power supply voltage VDD1 is supplied prior to power supply voltage VDD2, as shown in FIG. 3, etc. Moreover, in the level shift circuit according to Embodiment 2, an output signal having a greater voltage amplitude than an input signal is generated. In other words, power supply voltage VDD1 is higher than power supply voltage VDD2 (VDD1>VDD2). Power supply voltage VDD1 and power supply voltage VDD2 are positive voltages.

As a simplified example configuration, level shift circuit 100 of FIG. 10 includes an input unit 111 and an output unit 121 each configured of a single inverter. Specifically, input unit 111 has an inverter 110 which operates with voltages from a power supply line PL2 (power supply voltage VDD2) and a ground line SL (ground voltage VSS). Similarly, output unit 121 has an inverter 120 which operates with voltages from a power supply line PL1 (power supply voltage VDD1) and ground line SL (ground voltage VSS). Inverters 110 and 120 are each configured of a CMOS (Complementary MOS) inverter having a P-type transistor and a N-type transistor (which are not shown) connected in series. In other words, input unit 111 that operates with power supply voltage VDD2 corresponds to a specific example of second block 12 according to Embodiment 1, and output unit 121 that operates with power supply voltage VDD1 corresponds to a specific example of first block 11 according to Embodiment 1.

This allows level shift circuit 100 to implement a level translation function of converting input signal VIN whose amplitude is power supply voltage VDD2 into output signal VOUT whose amplitude is power supply voltage VDD1 (VDD1>VDD2). This allows the digital signal (output signal VOUT), whose amplitude is power supply voltage VDD1, to be supplied to the subsequent block or circuit operating with power supply voltage VDD1, thereby making sure that this subsequent block or circuit operates without leakage current.

In level shift circuit 100, during the operation from time t0 to t2 of FIG. 3, that is, the time period in which the supply of power supply voltage VDD1 starts and which is before the supply of power supply voltage VDD2 starts, when node Ni, which is an output node for inverter 110 and an input node for inverter 120, goes to a Hi-Z state, a shoot-through current may occur in inverter 120 receiving the supply of power supply voltage VDD1.

Accordingly, in level shift circuit 100, switch SW1 described in Embodiment 1 is placed between node N1 and power supply line PL2. In FIG. 10, since power supply voltage VDD2 is a positive voltage, switch SW1 can be configured of a N-type native transistor NN0, as with FIG. 2.

Figure 12:
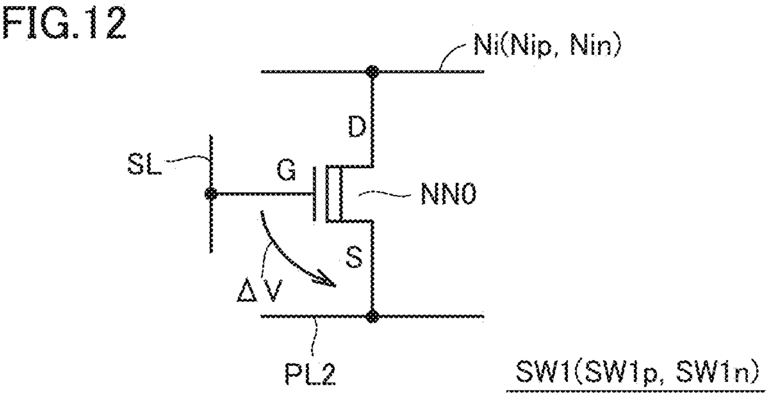
FIG. 12 is a circuit diagram showing an example configuration of a pull-down switch of FIGS. 10 and 11.

As shown in FIG. 12, switch SW1 is configured of a N-type native transistor NN0, which is connected between node N1 and power supply line PL2 of FIG. 10 and has the gate (a control electrode) connected to ground line SL.

As with Embodiment 1, native transistor NN0 constituting switch SW1 turns on when a voltage difference ΔV of power supply line PL2 from ground line SL is less than a voltage Vc and turns off when ΔV is greater than Vc.

This turns switch SW1 on, allowing level shift circuit 100 to pull down node Ni to clamp it to ground voltage VSS during a time period until power supply voltage VDD2 is supplied. This allows an N-type transistor (not shown) constituting the CMOS inverter to be fixed to off in inverter 120, preventing a shoot-through current from occurring.

In the time period in which the power supply voltage VDD2 is supplied, since switch SW1 is off, level shift circuit 100 is able to operate, without extra leakage current occurring at node Ni.

As a result, in level shift circuit 100, prevention of a shoot-through current upon activation and reduction of power consumption after the activation can both be implemented in the circuit implementing the above-described level translation function, as with the advantages effects of Embodiment 1.

Figure 11:
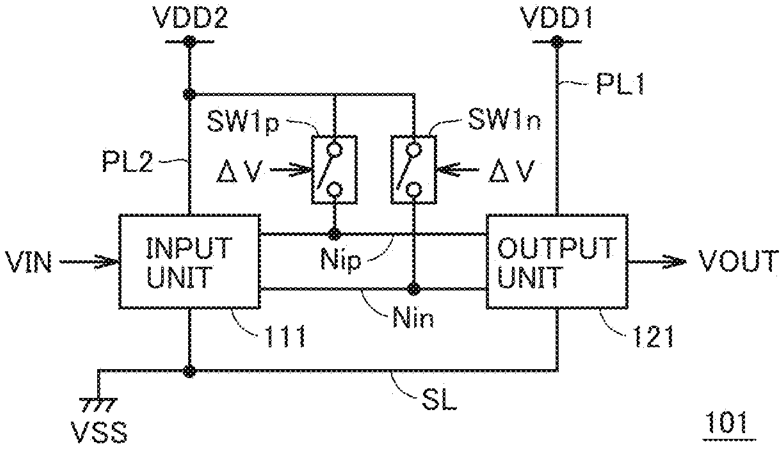
FIG. 11 is a schematic view illustrating a configuration of a level shift circuit according to Example 2 of Embodiment 2.

FIG. 11 is a schematic view illustrating a configuration of a level shift circuit 101 according to Example 2 of Embodiment 2.

Referring to FIG. 11, level shift circuit 101 is the same as the level shift circuit 100 of FIG. 10, except that an input unit 111 of level shift circuit 101 outputs to nodes Nip and Nin complementary differential signals whose amplitudes are power supply voltage VDD2. Accordingly, output unit 121 is configured to generate output signal VOUT whose amplitude is power supply voltage VDD1, based on the differential signals of nodes Nip and Nin. Power supply voltages VDD1 and VDD2 are supplied in level shift circuit 101 in the same manner as in level shift circuit 100 of FIG. 10. The use of the differential signals can provide enhanced noise immunity, in addition to the advantageous effects described with respect to level shift circuit 100.

In level shift circuit 101, at least one of a switch SW1*p* connected between node Nip and power supply line PL2 and a switch SW1*n* connected between node Nin and power supply line PL2 is provided. In other words, both or either one of switches SW1*p* and SW1*n* may be provided. Since power supply voltages VDD2 is positive voltage, switches SW1*p* and SW1*n* each may be configured of the same N-type native transistor NN0 as that of FIG. 2.

FIG. 12 shows an example configuration of switches SW1*p* and SW1*n* of FIG. 11.

Referring to FIG. 12, switch SW1*p* is configured of a N-type native transistor NN0, which is connected between node Nip and power supply line PL2 of FIG. 11 and has the gate (a control electrode) connected to ground line SL. Similarly, switch SW1*n* is configured of a N-type native transistor NN0, which is connected between node Nin and power supply line PL2 of FIG. 11 and has the gate (a control electrode) connected to ground line SL.

As with Embodiment 1, native transistors NN0 constituting switches SW1*p* and SW1*n* are on when voltage difference ΔV of power supply line PL2 from ground line SL is less than voltage Vc, and native transistors NN0 are off when ΔV is greater than Vc.

This turns switches SW1*p* and SW1*n* on, allowing level shift circuit 101 to pull down nodes Nip and Nin to clamp them to ground voltage VSS during a time period until power supply voltage VDD2 is supplied. This can prevent a shoot-through current from occurring inside the output unit 121.

In the time period in which the power supply voltage VDD2 is supplied, since switches SW1*p* and SW1*n* are turned off upon expansion of voltage difference ΔV, level shift circuit 101 is able to operate, without extra leakage current occurring in nodes Nip and Nin.

As a result, in level shift circuit 101, prevention of a shoot-through current upon activation and reduction of power consumption after the activation can both be implemented, as with the advantages effects of Embodiment 1, by placing at least one of switches SW1*p* and SW1*n*.

Figure 13:
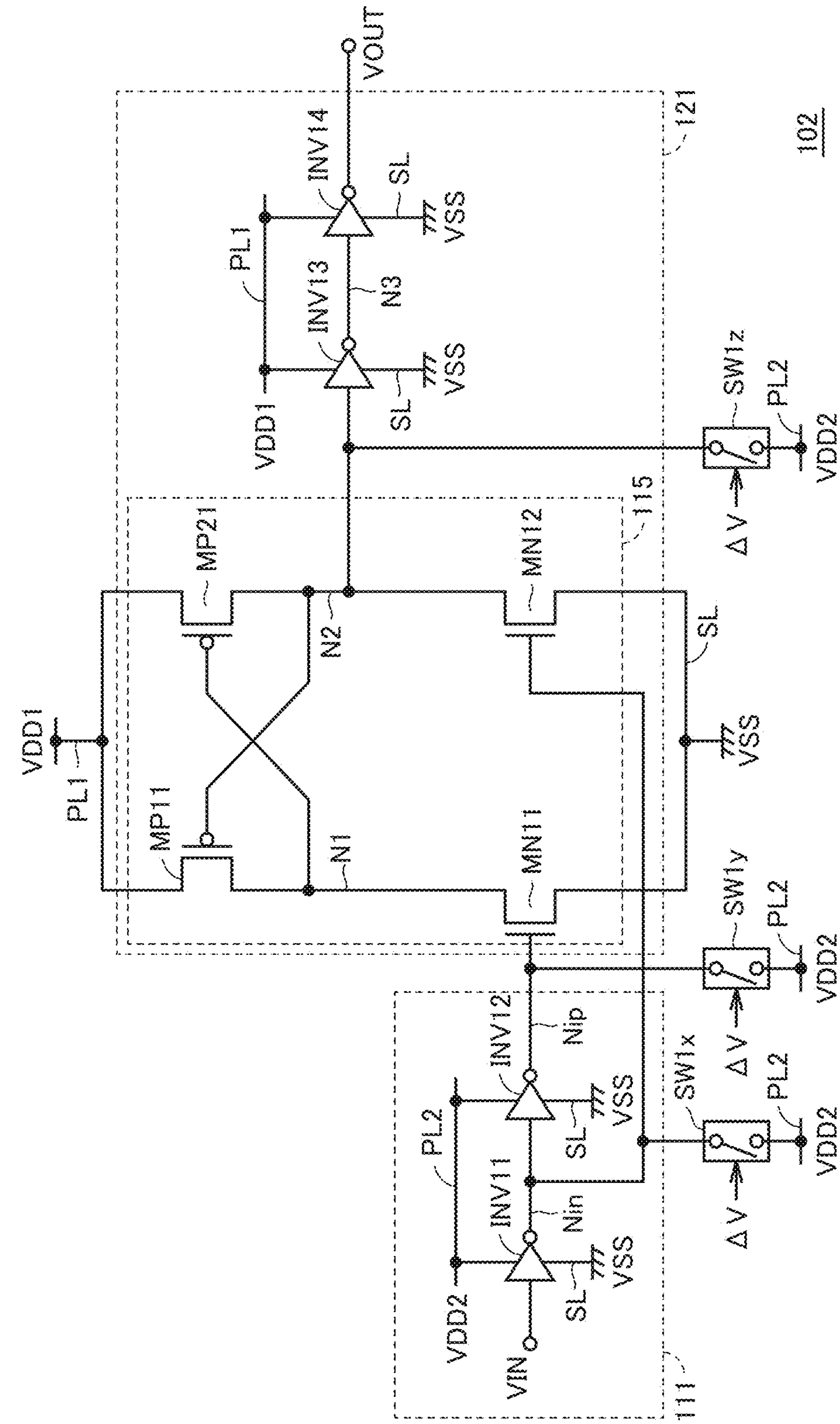
FIG. 13 is a circuit diagram illustrating a configuration of a level shift circuit according to Example 3 of Embodiment 2.

FIG. 13 is a circuit diagram illustrating a configuration of a level shift circuit 102 according to Example 3 of Embodiment 2. Level shift circuit 102 corresponds to a specific example configuration of input unit 111 and output unit 121 in level shift circuit 101 of FIG. 11.

Referring to FIG. 13, level shift circuit 102 includes: inverters INV11 and INV12 connected in series as an input stage; a cross-coupled circuit 115 configured of N-type transistors MN11 and MN12 and P-type transistors MP11 and MP21; and inverters INV13 and INV14 connected in series as an output stage.

Inverters INV11 and INV12 operate with voltages from power supply line PL2 (power supply voltage VDD2) and ground line SL (ground voltage VSS). Inverter INV11 outputs a signal obtained by inverting input signal VIN to node Nin. Inverter INV12 inverts the signal of node Nin and outputs the inverted signal to node Nip. As a result, a signal having the same phase as the input signal VIN is output to node Nip and a signal having a phase opposite the input signal VIN is output to node Nin. Amplitudes of input signal VIN and the signals of nodes Nip and Nin are power supply voltage VDD2.

In cross-coupled circuit 115, P-type transistors MP11 and MP21 are connected between power supply line PL1 (power supply voltage VDD1) and nodes N1 and N2, respectively. Transistor MP11 has the gate connected to node N2 and transistor MP21 has the gate connected to node N1.

Furthermore, N-type transistors MN11 and MN12 are connected between ground line SL and nodes N1 and N2, respectively. Transistor MN11 has the gate connected to node Nip and transistor MN12 has the gate connected to node Nin.

Due to this, in cross-coupled circuit 115, a voltage difference (VDD2/VSS) between nodes Nip and Nin is amplified to a voltage difference (VDD1/VSS) between nodes N1 and N2, and the voltage levels of nodes N1 and N2 are latched by transistors MP11 and MP21.

Inverter INV13 and inverter INV14 operate with voltages from power supply line PL1 (power supply voltage VDD1) and ground line SL (ground voltage VSS). Inverter INV13 inverts the signal of node N2 and outputs the inverted signal to a node N3. Inverter INV14 inverts the signal of node N3 to generate output signal VOUT.

In level shift circuit 102, input unit 111 of FIG. 11 can be configured of inverters INV11 and INV12, and output unit 121 of FIG. 11 can be configured of cross-coupled circuit 115 and inverters INV13 and INV14.

This allows level shift circuit 102 to convert input signal VIN, whose amplitude is power supply voltage VDD2, into output signal VOUT whose amplitude is power supply voltage VDD1 (VDD1>VDD2). In particular, level shift circuit 102 amplifies the voltage difference between the differential signals based on input signal VIN to generate output signal VOUT, thereby providing enhanced noise immunity, in addition to the advantages effects described with respect to level shift circuit 100.

In level shift circuit 102, during the time period from time t0 to t2 of FIG. 3, that is, the time period in which the power supply voltage VDD1 is supplied and which is before the supply of power supply voltage VDD2 starts, when nodes Nip, Nin, and N2 go to the Hi-Z state, a shoot-through current may occur in cross-coupled circuit 115 and inverters INV13 and INV14 receiving the supply of power supply voltage VDD1.

Accordingly, in level shift circuit 102, at least one of the following switches is placed: a switch SW1*x* connected between node Nin and power supply line PL2; a switch SW1*y* connected between node Nip and power supply line PL2; and a switch SW1*z* connected between node N2 and power supply line PL2. Since power supply voltage VDD2 is a positive voltage even in FIG. 13, switches SW1*x*, SW1*y*, and SW1*z* each can be configured of a N-type native transistor NN0, as with FIG. 2.

Figure 14:
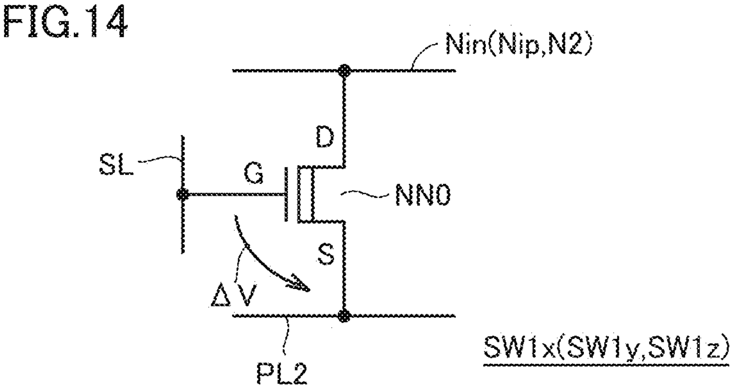
FIG. 14 is a circuit diagram showing an example configuration of a pull-down switch of FIG. 13.

FIG. 14 is a circuit diagram showing an example configuration of switches SW1*x*, SW1*y*, and SW1*z* of FIG. 13.

As shown in FIG. 14, switch SW1*x* is configured of a N-type native transistor NN0, which is connected between node Nin and power supply line PL2 of FIG. 13 and has the gate (a control electrode) connected to ground line SL. Similarly, switch SW1*y* is configured of a N-type native transistor NN0, which is connected between node Nip and power supply line PL2 of FIG. 13 and has the gate (a control electrode) connected to ground line SL. Switch SW1*z* is configured of a N-type native transistor NN0, which is connected between node N2 and power supply line PL2 of FIG. 13 and has the gate (a control electrode) connected to ground line SL.

As with Embodiment 1, native transistors NN0 constituting switches SW1*x* to SW1*z* are on when the absolute value $|\Delta V|$ of the voltage difference of power supply line PL2 from ground line SL is less than voltage Vc, and native transistors NN0 is off when $|\Delta V|$ is greater than Vc.

This turn switches SW1*x* to SW1*z* on, allowing level shift circuit 102 to pull down at least one of nodes Nin, Nip, and N2 and clamp it to ground voltage VSS during a time period until power supply voltage VDD2 is supplied. This can prevent a shoot-through current from occurring in cross-coupled circuit 115 and inverters INV13 and INV14.

In the time period in which the power supply voltage VDD2 is supplied, since switches SW1*x* to SW1*z* are turned off upon expansion of voltage difference ΔV, level shift circuit 102 is able to operate, without extra leakage current occurring in nodes Nin, Nip, and N2.

As a result, in level shift circuit 102, prevention of a shoot-through current upon activation and reduction of power consumption after the activation can both be implemented, as with the advantages effects of Embodiment 1, by placing at least one of switches SW1*x* to SW1*z*.

Figure 15:
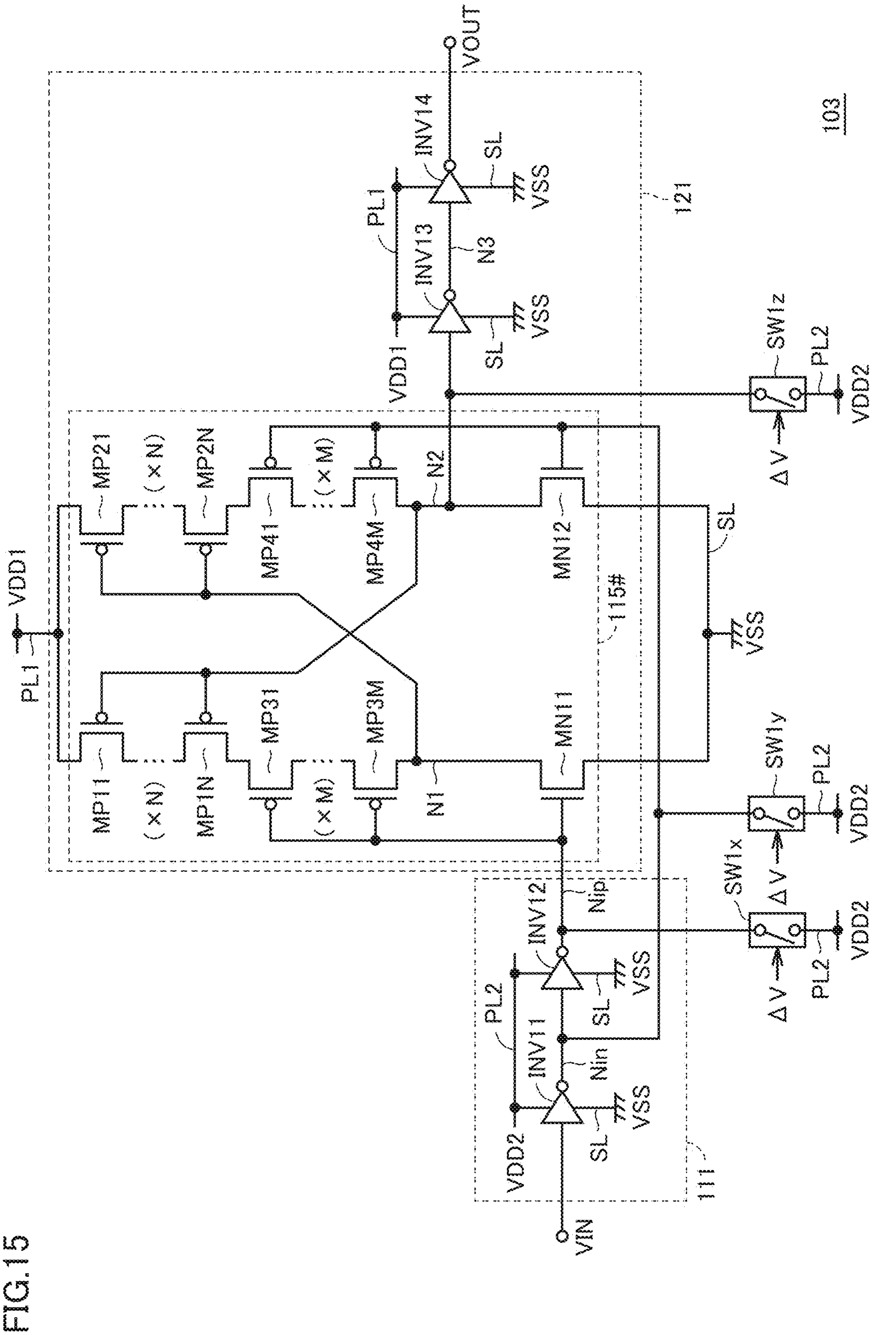
FIG. 15 is a circuit diagram illustrating a configuration of a level shift circuit according to Example 4 of Embodiment 2.

FIG. 15 is a circuit diagram illustrating a configuration of a level shift circuit 103 according to Example 4 of Embodiment 2.

Referring to FIG. 15, level shift circuit 103 is the same as the level shift circuit 102 of FIG. 13, except that the level shift circuit 103 includes a cross-coupled circuit 115 #, instead of cross-coupled circuit 115. The other configuration of level shift circuit 103 is the same as the level shift circuit 102. In other words, in level shift circuit 103 also, input unit 111 of FIG. 11 can be configured of inverters INV11 and INV12 and output unit 121 of FIG. 11 can be configured of cross-coupled circuit 115 # and inverters INV13 and INV14.

Cross-coupled circuit 115 #is the same as the cross-coupled circuit 115 (FIG. 13), except for including a plural number of transistors connected in series between power supply line PL1 and nodes N1 and N2.

Specifically, N (N: a natural number) P-type transistors MP11 to MP1N and M (M: a natural number) P-type transistors MP31 to MP3M are connected in series between node N1 and power supply line PL1. Transistors MP11 to MP1N each have the gate connected to node N2 and transistors MP31 to MP3M each have the gate connected to node Nip, as with transistor MN11.

Similarly, N P-type transistors MP21 to MP2N and M P-type transistors MP41 to MP4M are connected in series between node N2 and power supply line PL1. Transistor MP21 to MP2N each have the gate connected to node N1 and the transistors MP41 to MP4M each have the gate connected to node Nin, as with transistor MN12.

Since cross-coupled circuit 115 #is configured of a larger number of transistors, as compared to cross-coupled circuit 115, level shift circuit 103 can reduce the time required from the input of input signal VIN to the output of output signal VOUT to achieve a higher-speed operation, as compared to level shift circuit 102.

In level shift circuit 103, during the time period in which the supply of power supply voltage VDD1 starts and which is before the supply of power supply voltage VDD2 starts, when nodes Nip, Nin, and N2 go to the Hi-Z state, a shoot-through current may occur in cross-coupled circuit 115 #and inverters INV13 and INV14 receiving the supply of power supply voltage VDD1.

Accordingly, at least one of pull-down switches SW1*x*, SW1*y*, and SW1*z* (FIG. 14), respectively corresponding to nodes Nip, Nin, and N2, can be placed in level shift circuit 103, as with level shift circuit 102.

Due to this, in level shift circuit 103 also, prevention of a shoot-through current upon activation and reduction of power consumption after the activation can both be implemented, as with the advantages effects of Embodiment 1, by placing at least one of switches SW1*x* to SW1*z*.

Variation of Embodiment 2

In Variation of Embodiment 2, an example configuration of a level shift circuit operating with the power supply voltage being a negative voltage, is described.

Figure 16:
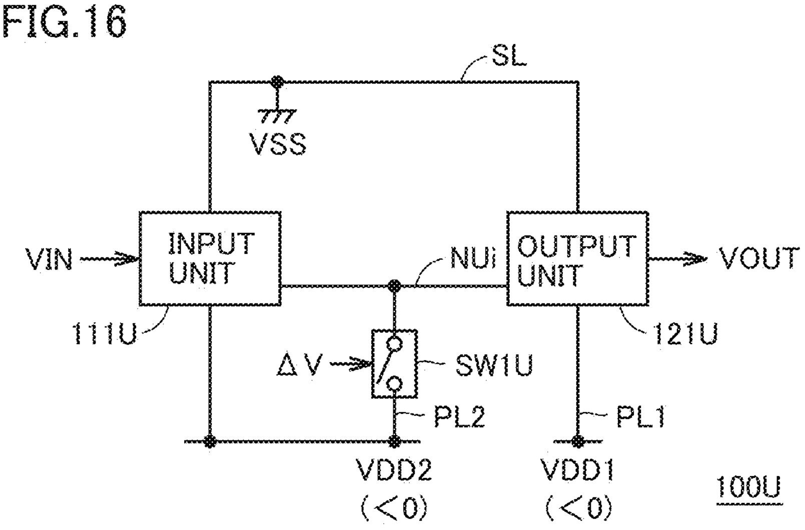
FIG. 16 is a schematic view illustrating a configuration of a level shift circuit according to Variation 1 of Embodiment 2.

FIG. 16 is a schematic view illustrating a configuration of a level shift circuit 100U according to Variation 1 of Embodiment 2. Level shift circuit 100U is an example configuration of level shift circuit 100 of FIG. 10 where both power supply voltages VDD1 and VDD2 are negative voltages. In this manner, power supply voltage VDD1 may also be either a positive voltage or a negative voltage, and the present embodiment is applicable to power supply voltages VDD1 and VDD2 having any combination of polarities (positive voltage/negative voltage).

Referring to FIG. 16, level shift circuit 100U includes: an input unit 111U which receives input signal VIN whose amplitude is power supply voltage VDD2 (VDD2<0); and an output unit 121U which generates an output signal VOUT whose amplitude is power supply voltage VDD1 (VDD1<0). In other words, input unit 111U corresponds to a specific example of second block 12 according to Embodiment 1, and output unit 121U corresponds to a specific example of first block 11 according to Embodiment 1.

Assume that, in the level shift circuit according to Variation 1 of Embodiment 2 also, power supply voltage VDD1 is supplied prior to power supply voltage VDD2, and an output signal having a greater voltage amplitude than an input signal is generated. In other words, power supply voltages VDD1 and VDD2 meets the relationship VDD1<VDD2<0 (VSS).

Input unit 111U can be configured of an inverter (not shown) that operates with voltages from power supply line PL2 (power supply voltage VDD2<0) and ground line SL, for example. Similarly, output unit 121U can be configured of an inverter (not shown) that operates with voltages from power supply line PL1 (power supply voltage VDD1<0) and ground line SL, for example.

In level shift circuit 100U, during the time period in which the supply of power supply voltage VDD1 starts and which is before the supply of power supply voltage VDD2 starts, when a node NUi, which is an output node for input unit 111U and an input node for output unit 121U, goes to a Hi-Z state, a shoot-through current may occur inside the output unit 121U receiving the supply of power supply voltage VDD1.

Accordingly, in level shift circuit 100U, a switch SW1U, which is the same as the switch SW1 of Embodiment 1, is placed between node NUi and power supply line PL2 of power supply voltage VDD2 which is supplied later. In FIG. 16, since power supply voltage VDD2 is a negative voltage, switch SW1U can be configured of a P-type native transistor NP0, as with FIG. 9.

Figure 17:
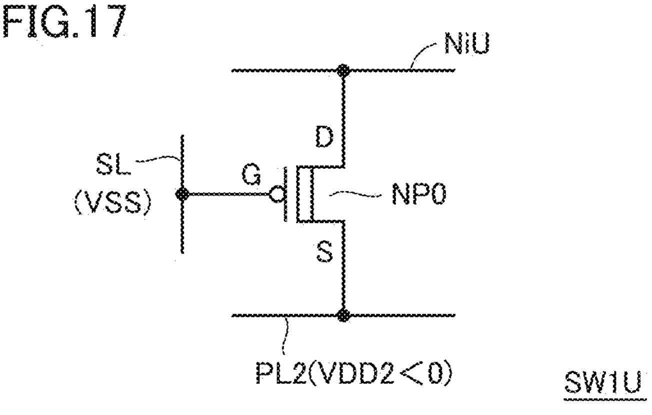
FIG. 17 is a circuit diagram showing an example configuration of a pull-down switch of FIG. 16.

As shown in FIG. 17, switch SW1U is configured of a P-type native transistor NP0, which is connected between node NUi and power supply line PL2 of FIG. 16 and has the gate (a control electrode) connected to ground line SL.

Native transistor NP0 constituting switch SW1U turns on when the voltage of power supply line PL2 is ground voltage VSS because the gate-source voltage is 0 [V] as described in Variation 3 of Embodiment 1. As the voltage of power supply line PL2 changes from ground voltage VSS to power supply voltage VDD2 (the negative voltage), in contrast, the gate (G) goes to a high potential relative to the source(S), and native transistor NP0, therefore, turns off. In other words, switch SW1U is on when the absolute value $|\Delta V|$ of a voltage difference between ground line SL and power supply line PL2 is less than voltage Vc, and SW1U is off when $|\Delta V|$ is greater than Vc.

This turns switch SW1U on, allowing level shift circuit 100U to clamp node NUi to ground voltage VSS during a time period until power supply voltage VDD2 is supplied. This can prevent a shoot-through current from occurring inside the output unit 121U.

In the time period in which the power supply voltage VDD2 is supplied, since switch SW1U is turned off upon expansion of the voltage difference (an absolute value) $|\Delta V|$, level shift circuit 100U is able to operate, without extra leakage current occurring in node NUi.

As a result, in level shift circuit 100U, prevention of a shoot-through current upon activation and reduction of power consumption after the activation can both be implemented, as with the advantages effects of Embodiment 1, by placing switch SW1U.

Figure 18:
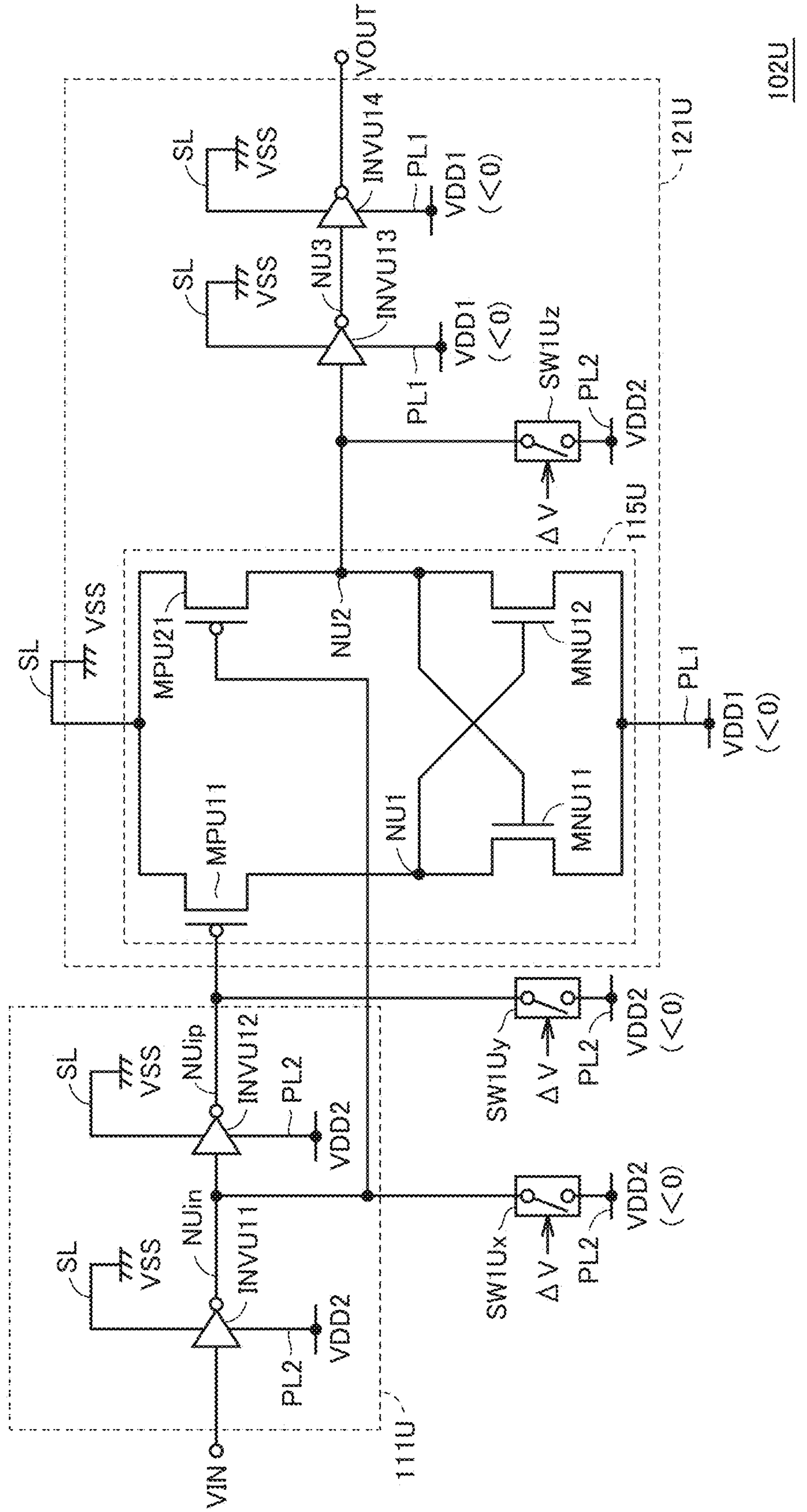
FIG. 18 is a schematic view illustrating a configuration of a level shift circuit according to Variation 2 of Embodiment 2.

FIG. 18 shows a circuit diagram illustrating a configuration of a level shift circuit 102U according to Variation 2 of Embodiment 2. Level shift circuit 102U corresponds to the level shift circuit 102 (FIG. 13) operating using the differential signals in an example configuration in which the power supply voltages VDD1 and VDD2 are both negative voltages. In FIG. 18, assume that the power supply voltages VDD1 and VDD2 meet VDD1<VDD2<0 (VSS) and the supply of power supply voltage VDD1 starts prior to the supply of power supply voltage VDD2.

Referring to FIG. 18, level shift circuit 102U includes: inverters INVU11 and INVU12 connected in series as an input stage; a cross-coupled circuit 115U configured of N-type transistors MNU11 and MNU12 and P-type transistors MPU11 and MPU21; and inverters INVU13 and INVU14 connected in series as an output stage.

Inverters INVU11 and INVU12 operate with voltages from ground line SL (ground voltage VSS) and power supply line PL2 (power supply voltage VDD2<0). Inverter INVU11 outputs a signal obtained by inverting input signal VIN to a node NUin. Inverter INVU12 inverts the signal of node NUin and outputs the inverted signal to a node NUip. As a result, a signal having the same phase as the input signal VIN is output to node NUip, and a signal having a phase opposite the input signal VIN is output to node NUin. Amplitudes of input signal VIN and the signals of nodes NUip and NUin correspond to power supply voltage VDD2.

In cross-coupled circuit 115U, P-type transistors MPU11 and MPU21 are connected between ground line SL (ground voltage VSS) and nodes NU1 and NU2, respectively. Transistor MPU11 has the gate connected to node NUip and transistor MPU21 has the gate connected to node NUin.

Furthermore, N-type transistors MNU11 and MNU12 is connected between power supply line PL1 (power supply voltage VDD1<0) and nodes NU1 and NU2, respectively. Transistor MNU11 has the gate connected to node NU2 and transistor MNU12 has the gate connected to node NU1.

Due to this, in cross-coupled circuit 115U, a voltage difference (VSS/VDD2) between nodes NUip and NUin is amplified to a voltage difference (VSS/VDD1) between nodes NU1 and NU2, and the voltage levels of nodes NU1 and NU2 are latched by transistors MNU11 and MNU12.

Inverter INVU13 and inverter INVU14 operate with voltages from ground line SL (ground voltage VSS) and power supply line PL1 (power supply voltage VDD1<0). Inverter INVU13 inverts the signal of node NU2 and outputs the inverted signal to node NU3. Inverter INVU14 inverts the signal of node NU3 to generate output signal VOUT.

In level shift circuit 102U, input unit 111U of FIG. 16 can be configured of inverters INVU11 and INVU12 and to output differential signals. Furthermore, output unit 121U of FIG. 16 can be configured of cross-coupled circuit 115U and inverters INVU13 and INVU14 and to operate with the differential signals.

This allows level shift circuit 102U to convert input signal VIN, whose amplitude is power supply voltage VDD2 which is a negative voltage, into output signal VOUT whose amplitude is power supply voltage VDD1 (|VDD1|>|VDD2|) which is a negative voltage. Level shift circuit 102U can amplify the voltage difference between the differential signals based on input signal VIN to generate output signal VOUT, thereby providing enhanced noise immunity.

In level shift circuit 102U, during the time period in which the supply of power supply voltage VDD1 starts and which is before the supply of power supply voltage VDD2 starts, as nodes NUip, NUin, and NU2 go to the Hi-Z state, a shoot-through current may occur in cross-coupled circuit 115U and inverters INVU13 and INVU14 receiving the supply of power supply voltage VDD1.

Accordingly, in level shift circuit 102U, at least one of the following switches is placed: switch SW1Ux connected between node NUin and power supply line PL2 which receives the supply of power supply voltage VDD2 the supply of which starts later; switch SW1Uy connected between node NUip and power supply line PL2; and switch SW1Uz connected between node NU2 and power supply line PL2. Since power supply voltage VDD2 is a negative voltage also in FIG. 18, switches SW1Ux, SW1Uy, and SW1Uz each can be configured of a P-type native transistor NP0, as with FIG. 9.

Figure 19:
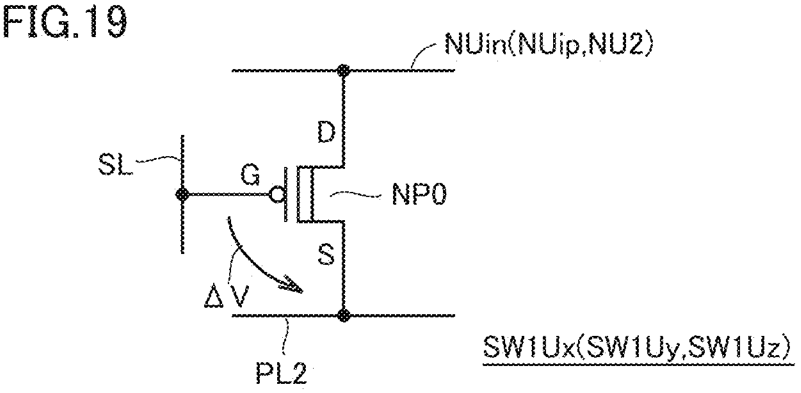
FIG. 19 is a circuit diagram showing an example configuration of a pull-down switch of FIG. 18.

FIG. 19 is a circuit diagram showing an example configuration of switches SW1Ux, SW1Uy, and SW1Uz of FIG. 18.

As shown in FIG. 19, switch SW1Ux is configured of a P-type native transistor NP0, which is connected between node NUin and power supply line PL2 of FIG. 18 and has the gate (a control electrode) connected to ground line SL. Similarly, switch SW1Uy is configured of a P-type native transistor NP0, which is connected between node NUip and power supply line PL2 of FIG. 18 and has the gate (a control electrode) connected to ground line SL. Switch SW1Uz is configured of a P-type native transistor NP0, which is connected between node NU2 and power supply line PL2 of FIG. 18 and has the gate (a control electrode) connected to ground line SL.

Native transistors NP0 constituting switches SW1Ux to SW1Uz are on when voltage difference (an absolute value) |ΔV| between ground line SL and power supply line PL2 is less than voltage Vc, and transistors NP0 are off when |ΔV| is greater than Vc, as with Variation 3 of Embodiment 1.

This turns switches SW1Ux to SW1Uz on, allowing level shift circuit 102U to pull down at least one of nodes NUin, NUip, and NU2 to clamp it to ground voltage VSS during a time period until power supply voltage VDD2 is supplied. This can prevent a shoot-through current from occurring in cross-coupled circuit 115U and inverters INVU13 and INVU14.

In the time period in which the power supply voltage VDD2 is supplied, since switches SW1Ux to SW1Uz are turned off upon expansion of voltage difference (an absolute value) |ΔV|, level shift circuit 102U is able to operate, without extra leakage current occurring in nodes NUin, NUip, and NU2.

As a result, in level shift circuit 102U, prevention of a shoot-through current upon activation and reduction of power consumption after the activation can both be implemented, as with the advantages effects of Variation 3 of Embodiment 1, by placing at least one of switches SW1Ux to SW1Uz.

Note that the number of N-type transistors that are connected between power supply line PL1 and nodes NU1 and NU2 in cross-coupled circuit 115U of FIG. 18 may be increased to (M+N) to achieve a higher-speed operation, as with FIG. 15.

Moreover, in the respective example configurations described in Embodiment 2 and the variation thereof, power supply voltage VDD2, which is supplied later, may be generated by voltage converter circuit 15 (FIG. 4) converting power supply voltage VDD1. Alternatively, switch SW2 of FIG. 5 may further be placed to make sure that power supply line PL2 is clamped to ground voltage VSS during a time period in which power supply voltage VDD2 is not supplied.

Note that while the level shift circuit is illustrated in Embodiment 2 and the variations thereof, the present embodiment is applicable to any devices, including digital-to-analog converters (DACs) or analog-to-digital converters (ADCs), if they are semiconductor devices including first block 11 and second block 12 that operate with the supply of the same power supply voltages VDD1 and VDD2 as those according to the present embodiment.

For confirmation purpose, the configurations described in the respective embodiments and the variations thereof described above, including combinations not mentioned in the specification, are intended to be combined as appropriate in the present application as originally filed to an extent that causes no inconsistency or conflict.

Note that while switch SW1 corresponding to the "first switch" is configured of the N-type or P-type native transistor in the present embodiment, the switch may be configured using a depletion-type transistor, instead of the native transistor. As is well known, a threshold voltage for the N-type depletion-type transistor is a negative voltage (e.g., about −0.5 [V]).

Accordingly, the use of a depletion-type transistor is advantageous in that the on-resistance is less than a native transistor when the gate-source voltage is 0 [V], that is, voltage difference ΔV=0. The use of a depletion-type transistor, on the other hand, is disadvantageous in that the power supply voltage VDD2 has a narrower applicable range because when a difference between power supply voltage VDD2 and ground voltage VSS is small, the "first switch" may not be able to be turned off even with the supply of power supply voltage VDD2. In other words, considering the level of power supply voltage VDD2, preferably, the "first switch" according to the present disclosure is configured by selectively applying a depletion-type transistor or a native transistor.

The presently disclosed embodiments should be considered illustrative in all aspects and do not limit the present disclosure. The scope of the present disclosure is defined by the appended claims, rather than by the above description. All changes which come within the meaning and range of equivalency of the appended claims are intended to be embraced within their scope.

REFERENCE SIGNS LIST

1*a*, 1*b*, 1*c* semiconductor device; 11 first block; 12 second block; 15 voltage converter circuit; 100, 100U, 101, 102, 102U, 103 level shift circuit; 110, 120, INV11 to INV14, INVU11 to INVU13, INVU14 inverter; 111, 111U input unit; 115, 115U, 115 #cross-coupled circuit; 121, 121U output unit; EN enable signal; NN0, NP0 native transistor; PL1, PL2 power supply line; SL reference voltage line (ground line); SW1, SW1*n*, SW1*p*, SW1*x*, SW1*y*, SW1*z*, SW1U, SW1Ux, SW1Uy, SW1Uz, SW2 switch; VDD1, VDD2 power supply voltage; and VSS reference voltage (ground voltage).

The invention claimed is:

1. A semiconductor device, comprising:

a first power supply line to receive supply of a first power supply voltage;

a second power supply line to receive supply of a second power supply voltage;

a reference voltage line to transfer a reference voltage;

a first circuit block to operate with the first power supply voltage and the reference voltage from the first power supply line and the reference voltage line;

a second circuit block to operate with the second power supply voltage and the reference voltage from the second power supply line and the reference voltage line; and a first switch connected between the second power supply line and a node which transfers a signal to be processed by the first circuit block or the second circuit block, wherein upon activation of the semiconductor device, a voltage of the first power supply line changes from the reference voltage to the first power supply voltage earlier than when a voltage of the second power supply line changes from the reference voltage to the second power supply voltage, and the first switch is on when the voltage of the second power supply line is the reference voltage, and the first switch turns off as the voltage of the second power supply line approaches the second power supply voltage.

2. The semiconductor device according to claim 1, wherein the first switch is configured to turn on when an absolute value of a voltage difference between the second power supply line and the reference voltage line is less than a predetermined voltage and turn off when the absolute value of the voltage difference is greater than the predetermined voltage.

3. The semiconductor device according to claim 2, wherein the first switch is a native transistor or a depletion-type transistor which has a control electrode connected to the reference voltage line.

4. The semiconductor device according to claim 3, wherein the second power supply voltage is a positive voltage, and the first switch is configured of a N-type native transistor or a depletion-type transistor.

5. The semiconductor device according to claim 3, wherein the second power supply voltage is a negative voltage, and the first switch is configured of a P-type native transistor or a depletion-type transistor.

6. The semiconductor device according to claim 1, further comprising a second switch connected between the second power supply line and the reference voltage line, wherein the second switch is off when the second circuit block is in operation, and on when the second circuit block is out of operation.

7. The semiconductor device according to claim 1, wherein the semiconductor device is a level shift circuit, the second circuit block is a signal input circuit to receive an input signal whose amplitude is the second power supply voltage, the first circuit block is a signal output circuit to output an output signal obtained by converting the input signal so that the output signal has an amplitude of the first power supply voltage, and the first switch is disposed at least between the second power supply line and a node which transfers the input signal or an inverted signal of the input signal.

8. The semiconductor device according to claim 1, wherein the first circuit block is an analog circuit whose power source is the first power supply voltage, and the second circuit block is a digital circuit whose power source is the second power supply voltage.

9. The semiconductor device according to claim 1, wherein the first circuit block is a digital circuit whose power source is the first power supply voltage, and the second circuit block is an analog circuit whose power source is the second power supply voltage.

10. The semiconductor device according to claim 1, wherein the first power supply line is supplied with the first power supply voltage external to the semiconductor device, the semiconductor device further includes a voltage converter circuit disposed between the first power supply line and the second power supply line, and the voltage converter circuit converts and outputs to the second power supply line the first power supply voltage supplied to the first power supply line.

11. The semiconductor device according to claim 1, wherein the second power supply voltage is output from the voltage converter circuit, which converts the first power supply voltage into the second power supply voltage, to the second power supply line.

* * * * *